(12) United States Patent
Blair et al.

(10) Patent No.: US 7,372,334 B2
(45) Date of Patent: May 13, 2008

(54) OUTPUT MATCH TRANSISTOR

(75) Inventors: Cindy Blair, Santa Clara, CA (US); Tan Pham, Orange, CA (US); Nagaraj V. Dixit, Maricopa, AZ (US); Thomas Moller, Santa Clara, CA (US)

(73) Assignee: Infineon Technologies AG (DE)

( * ) Notice: Subject to any disclaimer, the term of this patent is extended or adjusted under 35 U.S.C. 154(b) by 153 days.

(21) Appl. No.: 11/189,615

(22) Filed: Jul. 26, 2005

(65) Prior Publication Data
US 2007/0024374 A1 Feb. 1, 2007

(51) Int. Cl.
*H03F 3/191* (2006.01)
(52) U.S. Cl. .................................. 330/302; 330/66
(58) Field of Classification Search ............. 330/66, 330/285, 286, 302, 305, 307
See application file for complete search history.

(56) References Cited

U.S. PATENT DOCUMENTS

| | | | | |
|---|---|---|---|---|
| 4,580,114 A | 4/1986 | Upadhyayula | ............... | 333/100 |
| 6,099,677 A | 8/2000 | Logothetis et al. | ........... | 156/253 |
| 6,177,834 B1 | 1/2001 | Blair et al. | ................. | 327/566 |
| 6,466,094 B2 | 10/2002 | Leighton et al. | ............ | 330/302 |
| 6,614,308 B2 | 9/2003 | Moller et al. | ................ | 330/295 |
| 6,734,728 B1 | 5/2004 | Leighton et al. | .............. | 330/66 |
| 6,777,791 B2 | 8/2004 | Leighton et al. | ............ | 257/678 |
| 6,822,321 B2 | 11/2004 | Crescenzi, Jr. | ............... | 257/691 |
| 7,138,872 B2* | 11/2006 | Blednov | ..................... | 330/302 |
| 7,158,386 B2* | 1/2007 | Shih et al. | ................... | 330/295 |

FOREIGN PATENT DOCUMENTS

WO      95/31037 A1    11/1995

OTHER PUBLICATIONS

Partial European Search Report for European Application No. EP 06015435 (4 pages).

\* cited by examiner

*Primary Examiner*—Khanh Van Nguyen
(74) *Attorney, Agent, or Firm*—Coats & Bennett, P.L.L.C.

(57) ABSTRACT

A power transistor, having: a semiconductor having an electrode formed thereon, wherein the electrode comprises a plurality of interdigitated transistors each having input and output terminals; a first output blocking capacitor having a first terminal electrically coupled to the output terminals of the interdigitated transistors of the semiconductor and a second terminal electrically coupled to ground; and a second output blocking capacitor having a first terminal electrically coupled to the first terminal of the first output blocking capacitor and a second terminal electrically coupled to ground. A method for amplifying signals, the method having: forming a power transistor on a semiconductor, wherein the power transistor comprises a plurality of interdigitated transistors; shunting an output signal from the plurality of interdigitated transistors; and double-shunting an output signal from the plurality of interdigitated transistors, wherein the shunting and double-shunting generates first and second harmonic terminations at a die plane of the power transistor.

23 Claims, 4 Drawing Sheets

OUTPUT MATCH TRANSISTOR

TECHNICAL FIELD OF THE INVENTION

The present invention generally relates to the field of radio frequency (RF) power transistor devices and, more specifically, to internally mached RF power transistors.

BACKGROUND

RF power transistor devices are generally known for use as signal amplifiers in wireless communication applications. As demand for wireless communication applications has increased, the operating frequency for wireless networks has also increased. Operating frequencies are now well into the gigahertz range.

Natural variables in individual transistor elements have made mass production of RF power transistors problematic. Transistor devices naturally vary as to input capacitance, gain and phase shift. Particular transistor devices are preliminarily characterized over a range of expected operating frequencies and voltages. Further devices are then made using like materials in an attempt to make these devices operate within the characterized ranges. Due to the variations in transistors and various other elements over identical operating frequencies and voltages, however, the ability to successfully tune transistor devices on a large scale manufacturing basis is limited.

RF power transistor devices generally have a plurality of electrodes formed on a silicon die, each electrode having a plurality of interdigitated transistors. The individual transistors of each electrode are connected to respective common input (gate) and output (drain) leads for each electrode. As is known, the die is generally attached by a eutectic die attach process atop a metallic (source) substrate. The substrate is mounted to a metal flange, which serves as both a heat sink and a ground reference. The input (gate) and output (drain) lead frames are attached to the sides of the flange. The lead frames are electrically isolated from the metal (source) substrate and are coupled to the electrode input and output terminals, respectively, on the silicon die by multiple wires (i.e., bonded to the respective terminals and lead frames).

At high operating frequencies, it is particularly important that the input and output electrode terminals be impedance matched to the desired operating frequency ranges. In lower frequency (i.e.:<1 GHz) high power applications, the required inductances of shunt matching elements can cause the wires to be to long and few to handle the operating power. In some cases previous methodologies to solve this have lead to solutions with excessive cross talk between the input and output networks, causing instabilities.

Examples of RF power transistor devices available in the prior art are illustrated in U.S. Pat. No. 6,177,834 and U.S. Pat. No. 6,614,308, incorporated herein by reference.

SUMMARY

The present invention generally relates to the field of RF power transistor devices and, more specifically, to RF power transistors with an internal output match with a second harmonic termination at the die plane.

According to one aspect of the invention, there is provided a power transistor, having: a semiconductor having an electrode formed thereon, wherein the electrode comprises at least one transistor comprising input and output terminals, wherein the output terminals of the semiconductor are coupled to an output matching network by a first plurality of output conductors carrying an output inductance; a first output blocking capacitor comprising a first terminal coupled to the output terminals of the semiconductor by a second plurality of output conductors carrying an output inductance and a second terminal coupled to the ground; and a second output blocking capacitor comprising a first terminal coupled to the first terminal of the first output blocking capacitor by a third plurality of output conductors carrying an output inductance and a second terminal coupled to the ground.

Another aspect of the invention provides a broadband radio frequency (RF) signal amplifier, having: a power transistor attached to a surface of a pedestal having a reference ground, wherein the power transistor comprises at least one transistor device that is electrically connected to an RF input and an RF output, a bias input and a bias output, wherein the at least one transistor device comprises a gate tuning network and a double-shunt drain tuning network; a RF input path electrically connected to the at least one transistor device, an input matching network configured to couple the input signal to the transistor input at an input impedance, and a gate bias network configured to bias the transistor input to an input operating point; and a RF output path electrically connected to the transistor output, an output matching network configured to couple the respective component output signal to the transistor output at an output impedance, and a drain bias network configured to bias the transistor output to an output operating point.

According to a further aspect of the invention, there is provided a power transistor, having: a semiconductor having an electrode formed thereon, wherein the electrode comprises a plurality of interdigitated transistors each having input and output terminals; a first output blocking capacitor having a first terminal electrically coupled to the output terminals of the interdigitated transistors of the semiconductor and a second terminal electrically coupled to ground; and a second output blocking capacitor having a first terminal electrically coupled to the first terminal of the first output blocking capacitor and a second terminal electrically coupled to ground.

Still another aspect of the invention provides a method for amplifying signals, the method having the following steps: forming a power transistor on a semiconductor, wherein the power transistor comprises a plurality of interdigitated transistors; shunting an output signal from the plurality of interdigitated transistors; and double-shunting an output signal from the plurality of interdigitated transistors, wherein the shunting and double-shunting generates first and second harmonic terminations at a die plane of the power transistor.

The objects, features, and advantages of the present invention will be readily apparent to those skilled in the art upon a reading of the description of the preferred embodiments that follows.

BRIEF DESCRIPTION OF THE DRAWINGS

The present invention is better understood by reading the following description of non-limiting embodiments with reference to the attached drawings wherein like parts of each of the several figures are identified by the same referenced characters, and which are briefly described as follows.

It is to be noted, however, that the appended drawings illustrate only a few aspects of certain embodiments of this invention and are therefore not limiting of its scope, as the invention encompasses equally effective additional or equivalent embodiments.

DETAILED DESCRIPTION

The present invention generally relates to the field of radio frequency (RF) power transistor devices and, more specifically, to internally matched RF power transistors.

Figure 1:
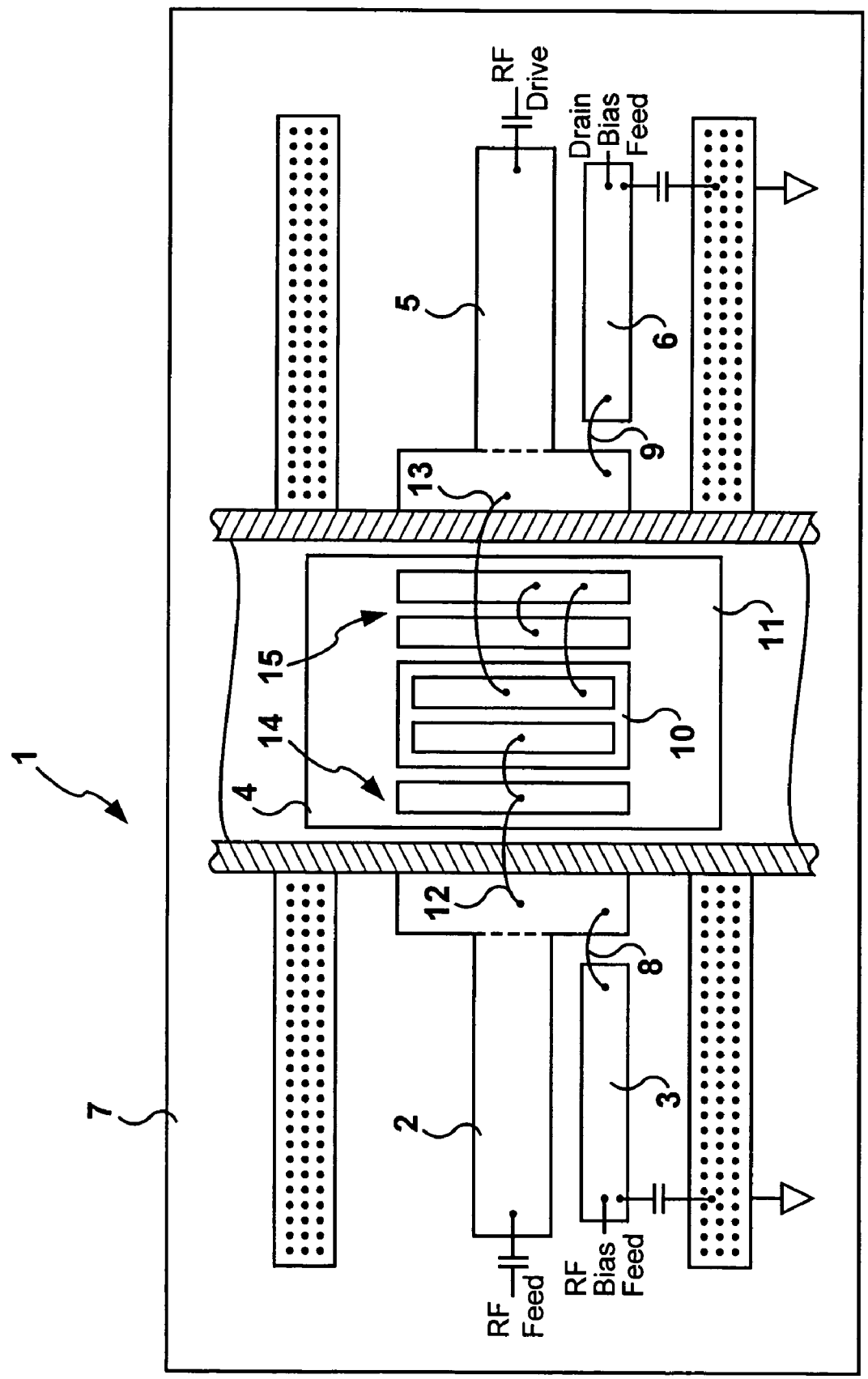
FIG. 1 is a top view of a schematic illustrating a physical layout and bond wire connections of an amplifier section of a broadband amplifier of one embodiment of the invention.

FIG. 1 illustrates an amplifier section 1 according to one aspect of the invention. The amplifier section 1 has a printed circuit board (PCB) 7 and a power transistor pedestal 11. The PCB 7 has as RF power input (not shown) for receiving a RF input signal and a RF power output (not shown) for outputting an amplified RF output signal. The pedestal 11 has a power transistor 4 attached thereto. The power transistor 4 amplifies a phase component signal of the RF input signal to thereby boost the power level from the RF power input to the RF power output as is known in the art. The pedestal 11 provides support for the circuit components of the power transistor 4; provides a high electrical conductivity for carrying common currents; and provides high thermal conductivity for cooling. The pedestal 11 may be made of copper or a copper alloy with properties optimized for thermal conductivity and electrical conductivity at the operating frequencies of the amplifier section 1. The pedestal 11 may be made of any material with similar electrical and thermal properties known to persons of skill.

The power transistor 4 has field effect transistors having an input (gate), output (drain) and common element (source) terminal formed on a semiconductor die attached to the pedestal 11. In one embodiment, the transistors are laterally diffused metal oxide semiconductor (LDMOS) transistors, with the source terminal formed on a bottom side of the die and directly attached to the pedestal 11. The PCB 7 may be a multi-layer module, such as taught in U.S. Pat. No. 6,099,677 to Logothetis et al., incorporated herein by reference.

FIG. 1 illustrates a top view of the physical layout and bond wire connections of the amplifier section 1 of the RF power transistor 4 of the present invention. The amplifier section 1 includes an input matching network 2, a gate bias network 3, a power transistor 4, an output matching network 5, and a drain bias network 6. While the illustrated amplifier section 1 is implemented with six amplifier sections, alternate embodiments may be implemented with two or more amplifier sections in accordance with the inventive aspects taught and described herein.

In the amplifier section 1, the input matching network 2 receives RF power in the form of a component input signal from a corresponding output of a splitter, designated as "RF FEED," to stimulate the gate of a transistor device 10 in the power transistor 4. The gate bias network 3 receives a dc bias voltage from an input bias source, designated as "GATE BIAS FEED," which is used to set the operating point for the transistor device 10. The power transistor 4 receives a power RF input component signal from the input matching network 2 and it receives the dc bias from the gate bias network 3. The power transistor 4 produces a high power RF output component signal that drives the output matching network 5. A combiner, designated as "RF DRIVE," receives the high power RF output component signal from the output matching network 5. The source of power, designated as "DRAIN BIAS FEED," for the high power output component signal is supplied from the drain bias network 6.

The power transistor 4 has a RF power transistor device 10, in a common source configuration, which is coupled to a pedestal 11. The transistor device 10 is a semiconductor having an electrode formed thereon, wherein the electrode has a plurality of interdigitated transistors each having input and output terminals. The power transistor 4 has an input 12, an output 13, a gate tuning network 14, and a drain tuning network 15. The power transistor input 12 receives RF input power from the input matching network 2 to stimulate the power transistor 4. RF output power developed by the power transistor 4 is delivered to the output matching network 5 at the power transistor output 13. A bias input 8 transmits a signal from the gate bias network 3 to the input matching network 2. A bias output 9 transmits a signal from the output matching network 5 to the drain bias network 6.

The bond wires used to connect the power transistor 4 to external nodes on the PCB 7, and to interconnect the components of the power transistor 4 located on the pedestal 11, have self-inductance that cannot be neglected at typical frequencies of operation. Several impedance transformations and tuning networks effectively couple RF power coming from the RF FEED to the gate of the transistor device 10. Similar impedance transformations and tuning networks also effectively couple RF power coming from the drain of the transistor device 10 to the RF DRIVE. A gate tuning network 14 compensates for the bond wire inductors and the input capacitance associated with the gate of the transistor device 10 and a drain tuning network 15 compensates for the bond wire inductors and capacitance associated with the drain of the transistor device 10.

Figure 2:
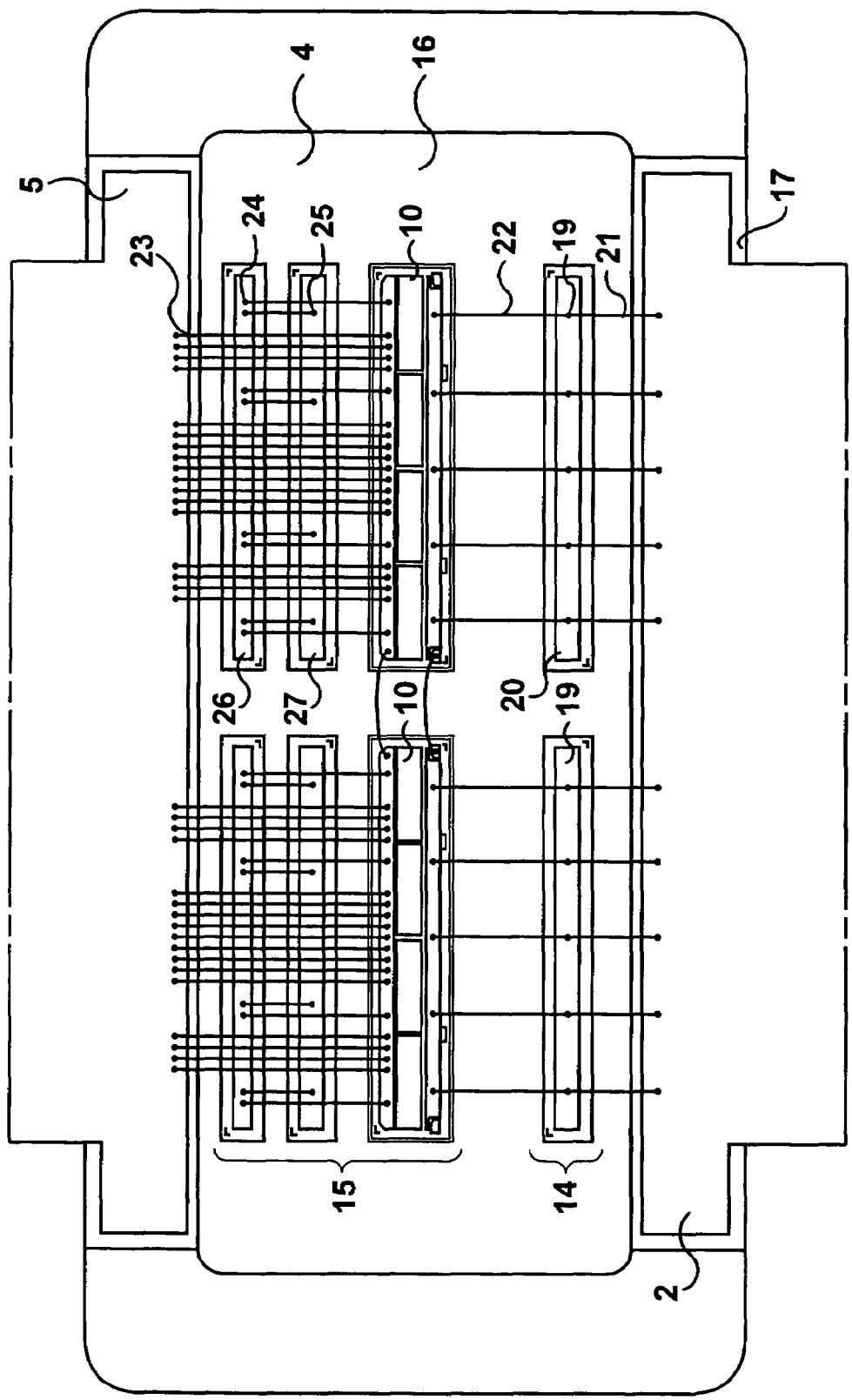
FIG. 2 is a top view of an illustrative LDMOS RF power transistor device embodiment of the invention.

Although the input 12 and output 13 are depicted as single conductors of minimum length, a skilled practitioner will appreciate that each conduction path may be formed with one or more bond wires. Selecting the number of bond wires applied in parallel, and the length of the bond wires, allows the inductance of the conduction path to be controlled and adjusted to convenient values. FIG. 2 illustrates the invention using a plurality of bond wires for the input 12 and output 13.

According to one embodiment of the invention, the broadband RF signal amplifier may have a plurality of power transistor devices 10 attached to a surface of the pedestal 11. The signal amplifier may also have an RF input path that has a splitter configured to split a RF input signal into a plurality of component input signals. The splitter, the input matching network 2 and the gate bias network 3 may be at least partially implemented in a printed circuit board. The signal amplifier may also have an RF output path having a combiner configured to combine component output signals received at the transistor outputs into a RF output signal. The combiner, output matching network 5 and drain bias network 6 may be at least partially implemented in a printed circuit board. In further embodiments, the signal amplifier has RF input and RF output paths 12 and 13 with respective input and output reference ground shelves implemented in a printed circuit board. Depending on the particular application, the pedestal 11 and printed circuit board may be arranged such that the input and output reference ground shelves are adjacent the pedestal surface.

Referring to FIG. 2, a top view is illustrated of an embodiment of a LDMOS RF power transistor 10 of the present invention. The power transistor 4 is positioned between an input lead 2 and an output lead 5 via the input (14 and associated bond wire inductances) and output (15 and associated bond wire inductances). In one embodiment of the invention, the input and output matching networks 2 and 5 are attached to, but electrically isolated from, a conductor 16 by a ceramic substrate 17. A pair of transistor devices (semiconductor dies) 10 are attached to a conductor (ground) 16. The transistor devices 10 may be attached by an ultrasonic scrubbing and/or thermal heating process. Each transistor device 10 has a plurality of interdigitated electrodes, wherein each electrode has an input (gate) terminal and an output (drain) terminal.

The gate tuning network 14 includes a "T-network." In one embodiment of the invention, the T-network transforms the impedance "looking" into the transistor input terminal at the fundamental frequency into a low impedance suitable for matching to the transistor device. Input matching of the transistor device 10 with the T-network is performed with an input matching capacitor 19. The input matching capacitor 19 is located through the conductor 16 near the input matching network 2. The input matching capacitor 19 has a first set of terminals 20 coupled to the input matching network 2 by a first set of input bonded wires 21. The first set of input bonded wires 21 are bonded at one end to the input matching network 2 and at the other end to the first set of terminals 20 of the input matching capacitor 19. The input matching capacitor 19 has a second terminal (not shown) coupled to the conductor (ground) 16. A second set of input bonded wires 22 couple the first set of terminals 20 of the input matching capacitor 19 to the respective input terminals of the interdigitated electrodes of the transistor devices 10. In particular, the second set of input bonded wires 22 is bonded at one end to the to the first set of terminals 20 and at the other end to the respective interdigitated electrode input terminals of the transistor devices 10. Input matching of the transistor device 10 is thereby performed by selection of the desired capacitance value of input matching capacitor 19 and the inductance of the first and second sets of input bonded wires 21 and 22.

An embodiment of the invention with a drain tuning network 15 includes an double-shunt network and a series inductance. The series inductance is the result of a first set of output bonded wires 23 connecting the drain of the interdigitated electrode output terminals of the transistor device 10 to the output matching network 5. The double-shunt network includes a second set of output bonded wires 24 coupled to a first output matching capacitor 26. The first output matching capacitor 26 has a second terminal (not shown) coupled to the conductor (ground) 16. The second set of output bonded wires 24 is also coupled to the interdigitated electrode drain terminals of the transistor device 10. The double-shunt network also includes a third set of output bonded wires 25 coupled to a second output matching capacitor 27. The second output matching capacitor 27 has a second terminal (not shown) coupled to the conductor (ground) 16. The third set of output bonded wires 25 is also coupled to the first output matching capacitor 26. In some embodiments of the invention, the values of the first output matching capacitor 26 and the second output matching capacitor 27 are frequency sensitive and are important for the harmonic termination aspect to work. The first output matching capacitor 26 may provide a high impedance at a frequency (f) and a low impedance at 2f. The second output matching capacitor 27 may provide a low impedance (DC block) at f.

Although the power transistor 10 illustrated may be implemented with nominal component values, the skilled practitioner will appreciate that the values of components 19 through 27 may be adjusted in order to achieve tuning for optimal performance from the power transistor 10.

Figure 3:
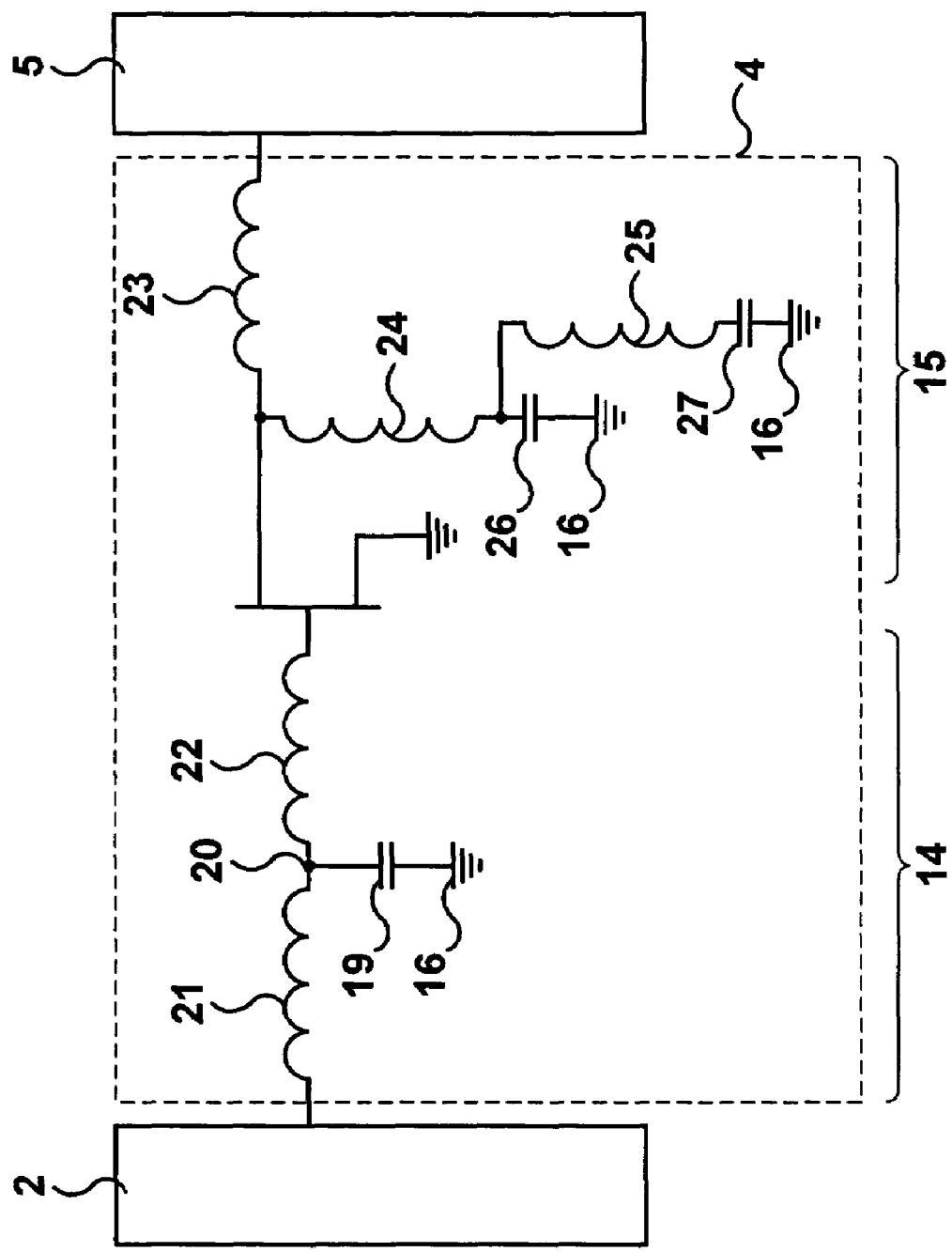
FIG. 3 is a schematic circuit diagram of the exemplary LDMOS RF power transistor device shown in FIG. 2.
Figure 4:
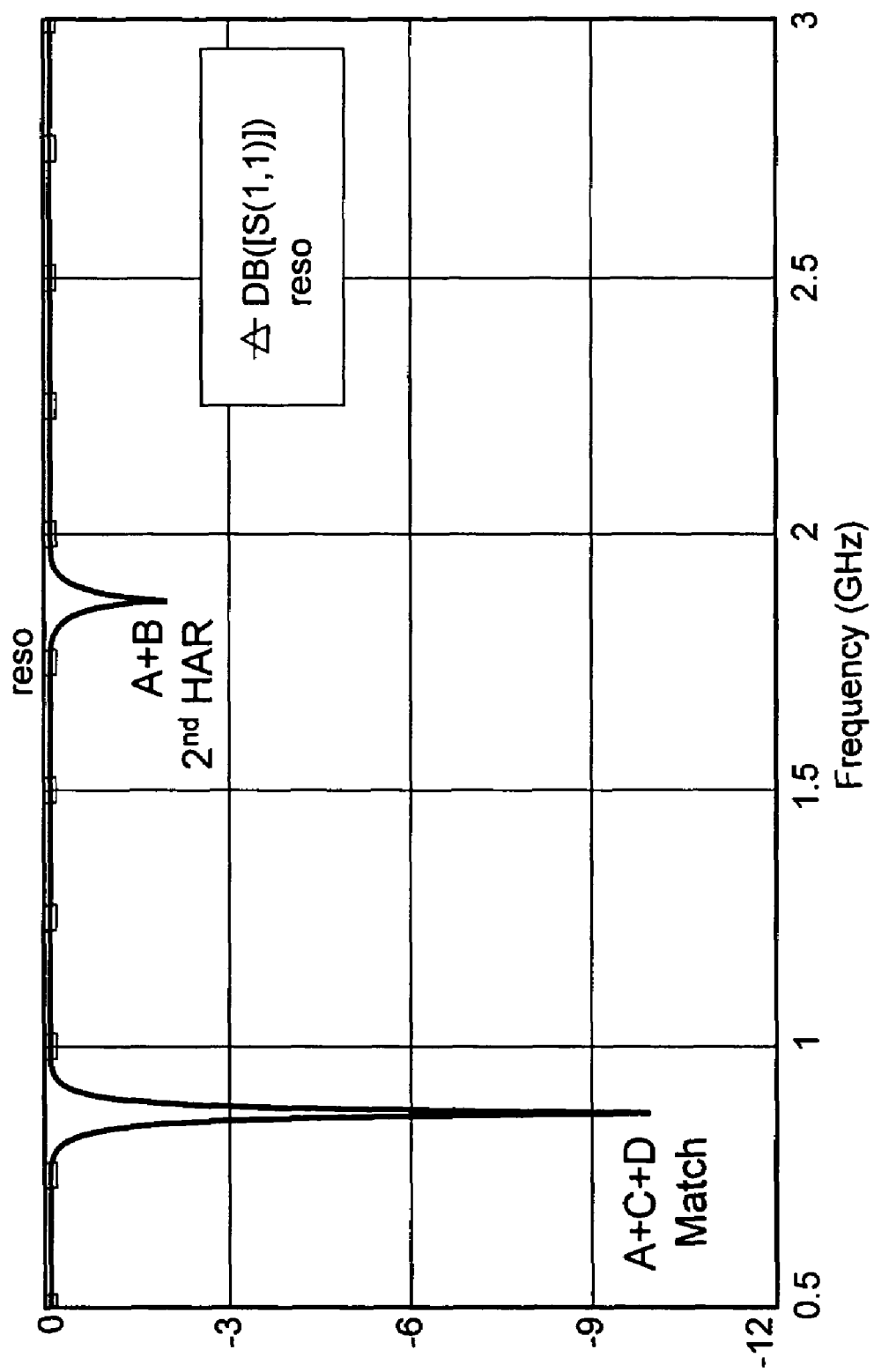
FIG. 4 is a graph illustrating first and second harmonic frequencies for one embodiment of the invention.

As noted above, an embodiment of the present invention has a drain tuning network that includes a double-shunt network. The second loop allows 900 MHz devices to be built with enough total inductance to allow for a shunt match at the die plane. This method shortens the drain wires by ½ their normal length. The double-shunt network of the present invention also provides a second harmonic termination at the die plane. Referring to FIG. 4, a graph is shown that illustrates the first and second harmonic frequencies that are produced with the double-shunt network. A first harmonic (900 MHz) is matched by the second set of output bonded wires 24, the third set of output bonded wires 25, and the second output matching capacitor 27 (see FIG. 3). A second harmonic (2 GHz—may need to adjust small cap value) is matched by the second set of output bonded wires 24 and the first output matching capacitor 26 (see FIG. 3). Thus, according to a further embodiment of the invention, a second harmonic termination is added at the die plane (bond loop from die using small cap as a block). At operating frequencies the double loop tuning allows any dissipated power in the tuning network to be shared between the 2 loops. This effectively doubles the allowable RF dissipation.

Therefore, the present invention is well adapted to carry out the objects and attain the ends and advantages mentioned as well as those that are inherent therein. While numerous changes may be made by those skilled in the art, such changes are encompassed within the spirit of this invention as defined by the appended claims.

What is claimed is:

1. An output match transistor, comprising:
   a semiconductor having an electrode formed thereon, wherein the electrode comprises at least one transistor comprising an input terminal and an output terminal, wherein the output terminal of the at least one transistor is coupled to an output matching network by a first plurality of output conductors carrying an output inductance;
   a first output blocking capacitor comprising a first terminal directly coupled to the output terminal of the semiconductor by a second plurality of output conductors carrying an output inductance and a second terminal coupled to the ground; and
   a second output blocking capacitor comprising a first terminal directly coupled to the first terminal of the first output blocking capacitor by a third plurality of output conductors carrying an output inductance and a second terminal coupled to the ground.

2. An output match transistor as claimed in claim 1, wherein the semiconductor is a LDMOS transistor.

3. An output match transistor as claimed in claim 1, wherein the first output blocking capacitor is positioned between the electrode and the output matching network.

4. An output match transistor as claimed in claim 1, wherein the second output blocking capacitor is positioned between the electrode and the output matching network.

5. An output match transistor as claimed in claim 1, further comprising an input matching capacitor comprising a first terminal coupled to an input matching network by a first plurality of input conductors carrying an input inductance and a second terminal coupled to a ground, wherein the first terminal is also coupled to the input terminal of the semiconductor by a second plurality of input conductors carrying an input inductance.

6. An output match transistor as claimed in claim 5, wherein the input matching capacitor is positioned between the input matching network and the electrode.

7. A broadband radio frequency (RE) signal amplifier, comprising:

a power transistor attached to a surface of a pedestal comprising a reference ground, wherein the power transistor comprises at least one transistor device that is electrically connected to a RF input and a RF output, a bias input and a bias output, wherein the at least one transistor device comprises a gate tuning network and a double-shunt drain tuning network, wherein the double-shunt drain tuning network comprises a first output blocking capacitor having a first terminal coupled to an output terminal of the at least one transistor device by a first plurality of output conductors carrying an output inductance and a second terminal coupled to the reference ground and a second output blocking capacitor having a first terminal coupled to the first terminal of the first output blocking capacitor by a second plurality of output conductors carrying an output inductance and a second terminal coupled to the reference ground;

a RF input path electrically connected to the at least one transistor device, an input matching network configured to couple an input signal to an input terminal of the at least one transistor device at an input inductance, and a gate bias network configured to bias the transistor input to an input operating point; and a RF output path directly electrically connected to the output terminal of the at least one transistor device, an output matching network configured to couple a respective component output signal to the transistor output at an output inductance, and a drain bias network configured to bias the transistor output to an output operating point.

8. A broadband RF signal amplifier as claimed in claim 7, wherein a plurality of power transistors are attached to a surface of a pedestal.

9. A broadband RF signal amplifier as claimed in claim 7, wherein the RF input path comprises a splitter configured to split a RF input signal into a plurality of component input signals and wherein the splitter, input matching network and gate bias network are at least partially implemented in a printed circuit board.

10. A broadband RF signal amplifier as claimed in claim 7, wherein the RF output path comprises a combiner configured to combine component output signals received at the transistor outputs into a RF output signal, and wherein the combiner, output matching networks and drain bias networks at least partially are implemented in a printed circuit board.

11. A broadband RF signal amplifier as claimed in claim 7, wherein the RF input and RF output paths comprise respective input and output reference ground shelves implemented in a printed circuit board, and the pedestal and printed circuit board are arranged such that the input and output reference ground shelves are adjacent the pedestal surface.

12. A broadband RF signal amplifier as claimed in claim 7,
wherein the RF output path is directly electrically connected to the transistor output terminal of the at least one transistor device by a third plurality of output conductors.

13. A broadband RF signal amplifier as claimed in claim 7, wherein:
a first harmonic is matched by the first plurality of output conductors, the second set of output conductors and the second output blocking capacitor; and
a second harmonic is matched by the first plurality of output conductors and the first output blocking capacitor.

14. A power transistor, comprising:
a semiconductor having an electrode formed thereon, wherein the electrode comprises at least one transistor comprising input and output terminals;
a first output blocking capacitor comprising a first terminal directly electrically coupled to the output terminal of the electrode of the semiconductor by a first plurality of conductors carrying an output inductance and a second terminal electrically coupled to ground; and
a second output blocking capacitor comprising a first terminal directly electrically coupled to the first terminal of the first output blocking capacitor by a second plurality of conductors carrying an output inductance and a second terminal electrically coupled to ground.

15. A power transistor as claimed in claim 14, wherein the first output blocking capacitor is positioned between the electrode and the second output blocking capacitor.

16. A method for amplifying signals, the method comprising:
forming a power transistor on a semiconductor, wherein the power transistor comprises a plurality of interdigitated transistors;
shunting an output signal from the plurality of interdigitated transistors by a first plurality of output conductors; and
double-shunting an output signal from the plurality of interdigitated transistors by a second plurality of output conductors, wherein the shunting and double-shunting generates first and second harmonic terminations at a die plane of the power transistor.

17. A method for amplifying signals as claimed in claim 16, wherein the shunting comprises electrically connecting a first output blocking capacitor to at least one of the plurality of interdigitated transistors by the first plurality of output conductors.

18. A method for amplifying signals as claimed in claim 17, wherein the double-shunting comprises electrically coupling a second output blocking capacitor to the first output blocking capacitor by the second plurality of output conductors.

19. A method for amplifying signals as claimed in claim 16, further comprising matching an input signal from an input matching network with a matching capacitor electrically connected to the input matching network.

20. A power transistor, comprising:
a semiconductor having an electrode formed thereon, wherein the electrode comprises at least one transistor comprising input and output terminals;
a first means for blocking output power directly electrically coupled to the output terminal of the electrode of the semiconductor by a first plurality of output conductors and electrically coupled to ground; and
a second means for blocking output power directly electrically coupled to the first means for blocking output power by a second plurality of output conductors and electrically coupled to ground.

21. A power transistor as claimed in claim 20, wherein the first means for blocking output power is positioned between the electrode and the second means for blocking output power.

22. A power transistor as claimed in claim 20, wherein the first and second means for blocking output power generate first and second harmonic terminations at a die plane of the power transistor.

23. A power transistor as claimed in claim 20, further comprising a means for matching input power electrically connected to an input matching network.

* * * * *